US012587306B2

(12) United States Patent
Zhu et al.

(10) Patent No.: US 12,587,306 B2
(45) Date of Patent: Mar. 24, 2026

(54) DATA TRANSMISSION METHOD AND APPARATUS, CIRCUIT BOARD, STORAGE MEDIUM AND ELECTRONIC APPARATUS

(71) Applicant: ZTE CORPORATION, Shenzhen (CN)

(72) Inventors: Shaofei Zhu, Shenzhen (CN); Zhaobi Wei, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 503 days.

(21) Appl. No.: 18/001,385

(22) PCT Filed: Jun. 2, 2021

(86) PCT No.: PCT/CN2021/097933
§ 371 (c)(1),
(2) Date: Dec. 9, 2022

(87) PCT Pub. No.: WO2021/249260
PCT Pub. Date: Dec. 16, 2021

(65) Prior Publication Data
US 2023/0246730 A1     Aug. 3, 2023

(30) Foreign Application Priority Data
Jun. 10, 2020    (CN) .......................... 202010525045.6

(51) Int. Cl.
*H04L 1/00*       (2006.01)
*H03M 1/00*      (2006.01)
(52) U.S. Cl.
CPC .......... *H04L 1/0006* (2013.01); *H04L 1/0041* (2013.01); *H03M 1/001* (2013.01)

(58) Field of Classification Search
CPC ..................................................... H04L 1/0006
(Continued)

(56) References Cited

U.S. PATENT DOCUMENTS 5,944,843 A    8/1999   Sharma et al.
6,282,172 B1   8/2001   Robles et al.
(Continued)

FOREIGN PATENT DOCUMENTS

CN      103219997 A   *   7/2013
CN      204480240 U     7/2015
(Continued)

OTHER PUBLICATIONS

The State Intellectual Property Office of People's Republic of China. First Office Action for CN Application No. 202010525045.6 and English translation, mailed Jul. 31, 2024, pp. 1-4.
(Continued)

*Primary Examiner* — Sibte H Bukhari
(74) *Attorney, Agent, or Firm* — Vivacqua Crane, PLLC

(57) ABSTRACT

Provided are a data transmission method, a circuit board, a data transmission apparatus, a storage medium and an electronic apparatus. The data transmission method is applied between a chip and an analog-to-digital/digital-to-analog (AD/DA) converter and includes transmitting first data through a first transmission channel. The first transmission channel includes invalid bits in a second transmission channel, the second transmission channel is configured to transmit second data, the first data includes customized data, and the second data includes traffic data.

10 Claims, 3 Drawing Sheets

(58) Field of Classification Search
USPC .......................................................... 370/329
See application file for complete search history.

(56)                          References Cited

U.S. PATENT DOCUMENTS

| | | | | | |
|---|---|---|---|---|---|
| 2018/0359117 | A1 * | 12/2018 | Wietfeldt | .............. | G06F 21/606 |
| 2019/0150193 | A1 * | 5/2019 | Harada | ................. | H04W 72/23 |
| | | | | | 370/329 |
| 2022/0030193 | A1 | 1/2022 | Geng et al. | | |

FOREIGN PATENT DOCUMENTS

| | | | | |
|---|---|---|---|---|
| CN | 103281164 | B | 1/2016 | |
| CN | 105871742 | A | 8/2016 | |
| CN | 110536167 | A | 12/2019 | |
| CN | 110753001 | A | 2/2020 | |
| CN | 110971291 | A | 4/2020 | |
| WO | WO-2019014923 | A1 * | 1/2019 | ............ H04W 72/23 |

OTHER PUBLICATIONS

The State Intellectual Property Office of People's Republic of China. First Search Report for CN Application No. 202010525045.6 and English translation, mailed Jul. 31, 2024, pp. 1-4.
International Searching Authority. International Search Report and Written Opinion for PCT Application ho. PCT/CN2021/097933 and English translation, mailed Aug. 20, 2021, pp. 1-9.
European Patent Office. Extended European Search Report for EP Application No. 21822239.6, mailed Sep. 29, 2023, pp. 1-8.

* cited by examiner

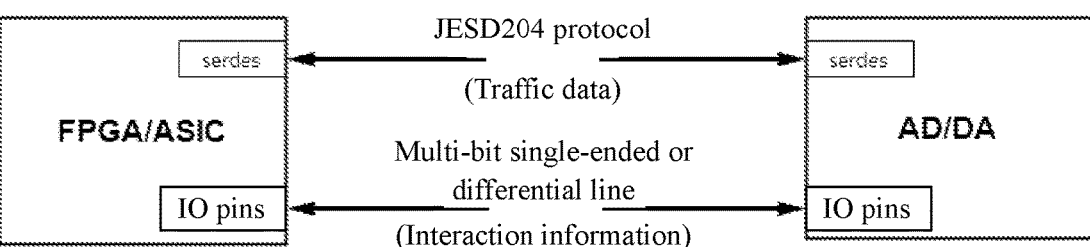
Fig. 1
Transmit first data through a first transmission channel, where the first transmission channel includes invalid bits in a second transmission channel, the second transmission channel is configured to transmit second data, the first data include customized data, and the second data include traffic data    S202
Fig. 2
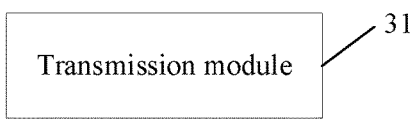
Fig. 3
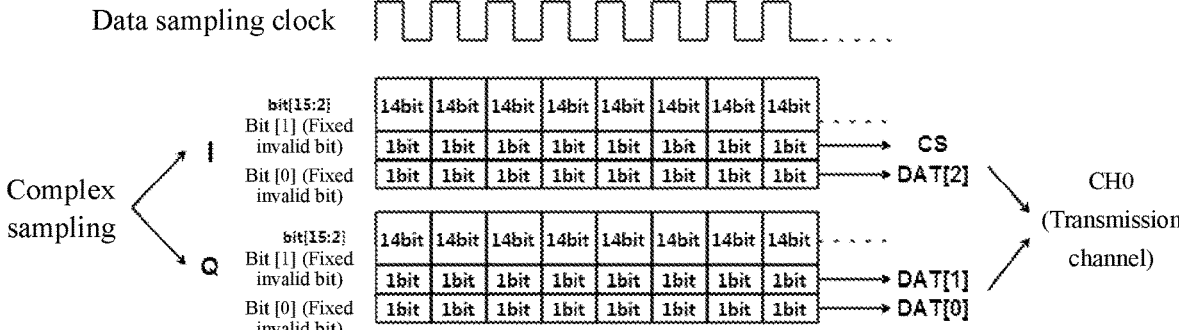
Fig. 4

Data sampling
clock

Sampled
data

CH0
(Transmission
channel that is
valid within a
period of time)

Valid time period for the superfluous
invalid bits

One data packet

Valid time period for the superfluous
invalid bits

DATA TRANSMISSION METHOD AND APPARATUS, CIRCUIT BOARD, STORAGE MEDIUM AND ELECTRONIC APPARATUS

CROSS-REFERENCE TO RELATED APPLICATION

This application is a national stage filing under 35 U.S.C. § 371 of international application number PCT/CN2021/097933, filed Jun. 2, 2021, which claims priority to Chinese patent application No. 202010525045.6, filed Jun. 10, 2020. The contents of these applications are incorporated herein by reference in their entirety.

TECHNICAL FIELD

Embodiments of the present disclosure relate to the field of communications and, in particular, a data transmission method, a circuit board, a data transmission apparatus, a non-transitory computer readable storage medium and an electronic apparatus.

BACKGROUND

In the existing technology, data interaction between an Artificial Intelligence (AI) chip and an analog-to-digital/digital-to-analog (AD/DA) converter (also referred to as an analog-to-digital and digital-to-analog converter) may be performed through interface protocols, such as a JESD204 protocol. JESD204 is an interface protocol for the data interaction between the AD/DA converter and the AI chip (such as a Field Programmable Gate Array (FPGA) or an Application Specific Integrated Circuit (ASIC)) commonly used in the art. FIG. 1 is a schematic diagram of the data interaction between the chip and the AD/DA converter in the existing technology. As shown in FIG. 1, in actual use, communications between the AI chip and the AD/DA converter also require a large amount of interaction of additional signals, such as control signal interaction, in addition to the data transmission. At present, these additional signals (e.g., the control signal) are interchanged through Input Output (IO) pins on the chip.

At present, the number of devices integrated on a PCB board increases, and the number of channels integrated in a single device also increases, resulting in the following problems in the design:

From the perspective of chip development: more single-ended or differential pins are required to transmit the IO pin signals, causing a larger number of interconnection lines.

From the perspective of single board design: the wiring is denser, and more signal layers are required on the PCB to support the design, which not only increases the pressure on the wiring layout, but also increases the overall costs.

Therefore, in terms of the current design, how to reduce the number of interconnection lines on the single board becomes an important problem.

SUMMARY

An embodiment of the present disclosure provides a data transmission method and apparatus, a circuit board, a storage medium, and an electronic apparatus.

According to an embodiment of the present disclosure, there is provided a data transmission method applied between a chip and an AD/DA converter, the method including transmitting first data through a first transmission channel, where the first transmission channel includes invalid bits in a second transmission channel, the second transmission channel is configured to transmit second data, the first data includes customized data, and the second data includes traffic data.

According to an embodiment of the present disclosure, there is also provided a circuit board, including a chip, and an AD/DA converter, where first data are transmitted between the chip and the AD/DA converter through a first transmission channel, where the first transmission channel includes invalid bits in a second transmission channel, the second transmission channel is configured to transmit second data between the chip and the AD/DA converter, the first data includes customized data, and the second data includes traffic data.

According to another embodiment of the present disclosure, there is also provided a data transmission apparatus, including: a transmission module configured to transmit first data through a first transmission channel, where the first transmission channel includes invalid bits in a second transmission channel, the second transmission channel is configured to transmit second data, the first data includes customized data, and the second data includes traffic data.

According to yet another embodiment of the present disclosure, there is also provided a non-transitory computer-readable storage medium in which a computer program is stored, where the computer program is configured to, when executed, implement the steps of any of the above method embodiments.

According to yet another embodiment of the present disclosure, there is also provided an electronic apparatus, including a memory and a processor, where a computer program is stored in the memory, and the processor is configured to execute the computer program to implement the steps in any of the above method embodiments.

BRIEF DESCRIPTION OF DRAWINGS

FIG. 1 is a schematic diagram of interaction between a chip and an AD/DA converter in the existing technology;

FIG. 2 is a flowchart of a data transmission method according to an embodiment of the present disclosure;

FIG. 3 is a block diagram of a data transmission apparatus according to an embodiment of the present disclosure;

FIG. 4 is a schematic diagram of a transmission channel in a first example implementation according to an embodiment of the present disclosure;

DETAILED DESCRIPTION

Figure 5:
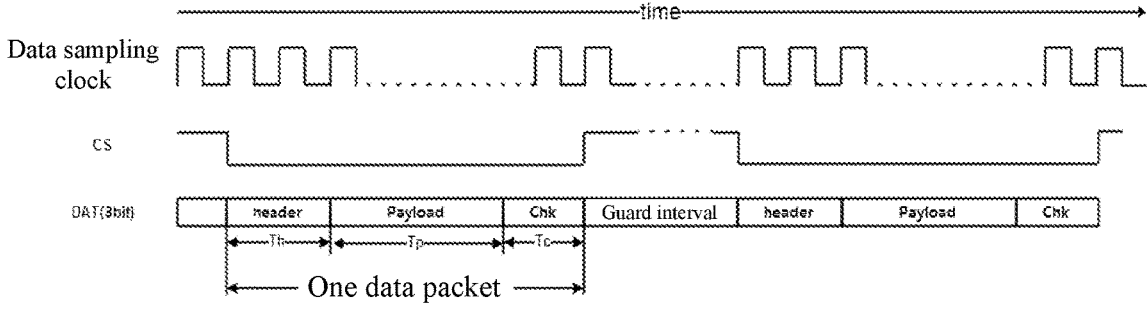
FIG. 5 is a schematic diagram of a data packet in the first example implementation according to an embodiment of the present disclosure.

The embodiments of the present disclosure will be described in detail below with reference to the accompanying drawings in conjunction with embodiments.

It should be noted that the terms "first", "second", etc. in the description and the claims of the present disclosure and the above-mentioned drawings are intended to distinguish similar objects and are not necessarily to describe a specific order or sequence.

This embodiment provides a data transmission method. The method is applied between a chip and an analog-to-digital and digital-to-analog converter. FIG. 2 is a flowchart of a data transmission method according to an embodiment of the present disclosure. As shown in FIG. 2, the process includes the following steps.

At S202, first data are transmitted through a first transmission channel, where the first transmission channel includes invalid bits in a second transmission channel, the second transmission channel is configured to transmit second data, the first data include customized data, and the second data include traffic data.

Through the step above, the invalid bits for transmitting the second data in the second transmission channel may be used for transmitting the first data, so that there is no need for additional interconnection lines to be deployed to transmit the first data. Thus, the problem of a large number of interconnection lines on a single board is solved, and the wiring of the single board is simplified.

It is to be noted that the method provided by the embodiments of the present disclosure may be applied between any AI chip and AD/DA converter. In an example implementation, the second data are transmitted through the second transmission channel between the AI chip and AD/DA converter. The second data may be the traffic data originally transmitted in between a SERializer/DESerializer (SERDES), and the first data may be customized data transmitted through the first transmission channel. The first transmission channel and the second transmission channel may be transmission channels between the SERDES.

Here, for example, the customized data may include data originally transmitted between IO pins, such as data originally required to be transmitted through additional wiring or the IO pins, specifically, control signals.

For example, assuming that a system needs to transmit data of one antenna (assumed to have a bit width of 32 bits) according to the JESD204C protocol, the channel for transmitting the data of one antenna is the traffic data channel (that is, the second transmission channel implements the transmission), and the transmission bit width is the 32 bits. Although the data of 32 bits are transmitted on the traffic data channel, some bits of the 32 bits are actually meaningless and do not carry any useful information. However, due to the requirements of 204C protocol itself, these bits, though meaningless, are still transmitted on the channel. Then, these meaningless bits are "invalid bits" stated in this embodiment, namely the invalid bits (i.e., the meaningless bits) on the traffic data channel (which is equivalent to the "second transmission channel"). In this implementation, these meaningless bits constitute the first transmission channel in which customized information is transmitted.

In this embodiment, the transmission bit width generally refers to the bit width of the traffic data channel, such as the preceding 32 bits. The transmission bit width carries meaningful data and meaningless data. In the method provided by this embodiment, these invalid bits are regarded as a new transmission channel (i.e., the first transmission channel mentioned above). Then, in this first transmission channel, all invalid bits within a time period (because there are very few invalid bits, it is impossible to transmit the customized information if only a certain point of time is considered) may be used for formation of a data packet. The customized information is placed in the data packet, and the data packet can be transmitted to the other side through the first transmission channel.

In an example implementation, before the first data are transmitted through the first transmission channel, the method further includes: causing the invalid bits in the second transmission channel to constitute the first transmission channel, where the invalid bits include at least one of:

a fixed invalid bit in the second transmission channel, where the fixed invalid bit is a preset invalid bit in the second transmission channel and does not carry the second data; or a superfluous invalid bit in the second transmission channel, where the superfluous invalid bit is the invalid bit superfluous for a bit width required by the second data in the second transmission channel.

In an example implementation, the first transmission channel includes at least one invalid bit in one second transmission channel, or the first transmission channel includes at least one invalid bit in a plurality of second transmission channels separately.

In an example implementation, transmitting first data through the first transmission channel includes: transmitting the first data through a first data transmission unit in the first transmission channel.

In an example implementation, the first data transmission unit includes at least one of: a type bit, a payload bit, or a check bit, where the type bit is configured to indicate a type of the first data transmission unit, the payload bit is configured to transmit the first data, and the check bit is configured to check the first data transmission unit.

In an example implementation, the first data transmission unit further includes at least one of: a start bit, a stop bit, a transmission validity time start bit, or a transmission validity time end bit, where the start bit is configured to indicate a start boundary of the first data transmission unit, the stop bit is configured to indicate an end boundary of the first data transmission unit, the transmission validity time start bit is configured to indicate that transmission validity time starts, and the transmission validity time end bit is configured to indicate that the transmission validity time ends.

In an example implementation, transmitting first data through a first transmission channel includes: transmitting the first data through one first transmission channel; or transmitting the first data through a plurality of first transmission channels separately. It is to be noted that, for example, in some cases, the first data may be relatively large and cannot be completely transmitted through one transmission channel at once. Therefore, the first data may be split and transmitted through multiple transmission channels.

In an example implementation, an idle state indication is transmitted in the first transmission channel when no first data are transmitted in the first transmission channel. It is to be noted that, for example, the idle state indication may be in a fixed code format.

In an example implementation, a clock of the first transmission channel is the same as a clock of the second transmission channel.

In an example implementation, the first transmission channel and the second transmission channel are parallel transmission channels between the same chip and AD/DA converter.

Through the description of the above embodiments, those having ordinary skill in the art can clearly understand that the method according to the above embodiments may be realized by means of software in addition to necessary general-purpose hardware platforms, and of course may also be realized by hardware, but the former is a more preferable implementation in many cases. Based on this understanding, the substance or the parts that contribute to the existing technology of the technical schemes of the present disclosure may be embodied in the form of software products, which are stored in a storage medium (such as ROM/RAM, magnetic disk, and optical disk) and include several instructions to cause a terminal device (such as a mobile phone, a computer, a server, or a network device) to perform the methods of various embodiments of the present disclosure.

This embodiment further provides a data transmission apparatus configured to implement the above embodiments and preferable implementations, which have been described above and will not be repeated here. As used below, the term "module" may be a combination of software and/or hardware that implements a predefined function. Although the device described in the following embodiments may preferably be implemented in software, implementations by hardware or a combination of software and hardware are also possible and contemplated.

FIG. 3 is a block diagram of a data transmission apparatus according to an embodiment of the present disclosure. As shown in FIG. 3, the apparatus includes:

a transmission module 31 configured to transmit first data through a first transmission channel, where the first transmission channel includes invalid bits in a second transmission channel, the second transmission channel is configured to transmit second data, the first data include customized data, and the second data include traffic data.

Through the step above, the invalid bits for transmitting the second data in the second transmission channel may be used for transmitting the first data, so that there is no need for additional interconnection lines to be deployed to transmit the first data. Thus, the problem of a large number of interconnection lines on a single board is solved, and the wiring of the single board is simplified.

In an example implementation, the transmission module 31 is further configured to cause the invalid bits in the second transmission channel to constitute the first transmission channel before transmitting the first data through the first transmission channel. The invalid bit includes at least one of:

a fixed invalid bit in the second transmission channel, where the fixed invalid bit is a preset invalid bit in the second transmission channel and does not carry the second data; or a superfluous invalid bit in the second transmission channel, where the superfluous invalid bit is the invalid bit superfluous for a bit width required by the second data in the second transmission channel.

In an example implementation, the first transmission channel includes at least one invalid bit in one second transmission channel, or the first transmission channel includes at least one invalid bit in a plurality of second transmission channels separately.

In an example implementation, the first data are transmitted through a first data transmission unit in the first transmission channel.

In an example implementation, the first data transmission unit includes at least one of: a type bit, a payload bit, or a check bit, where the type bit is configured to indicate a type of the first data transmission unit, the payload bit is configured to transmit the first data, and the check bit is configured to check the first data transmission unit.

In an example implementation, the first data transmission unit further includes at least one of: a start bit, a stop bit, a transmission validity time start bit, or a transmission validity time end bit, where the start bit is configured to indicate a start boundary of the first data transmission unit, the stop bit is configured to indicate an end boundary of the first data transmission unit, the transmission validity time start bit is configured to indicate that transmission validity time starts, and the transmission validity time end bit is configured to indicate that the transmission validity time ends.

In an example implementation, transmitting first data through a first transmission channel includes: transmitting the first data through one first transmission channel; or transmitting the first data through a plurality of first transmission channels separately.

In an example implementation, an idle state indication is transmitted in the first transmission channel when no first data are transmitted in the first transmission channel.

In an example implementation, a clock of the first transmission channel is the same as a clock of the second transmission channel.

In an example implementation, the first transmission channel and the second transmission channel are parallel transmission channels between the same chip and AD/DA converter.

It should be noted that the modules described above can be realized by software or hardware, and the latter can be implemented by but not limited to: the above modules being all located in one and the same processor; or the above modules being located separately in different processors in any combination thereof.

A further embodiment of the present disclosure provides a circuit board, including a chip, and an AD/DA converter, where first data are transmitted between the chip and the AD/DA converter through a first transmission channel, where the first transmission channel includes invalid bits in a second transmission channel, the second transmission channel is configured to transmit second data between the chip and the AD/DA converter, the first data include customized data, and the second data include traffic data.

Through the step above, the invalid bits for transmitting the second data in the second transmission channel may be used for transmitting the first data, so that there is no need for additional interconnection lines to be deployed to transmit the first data. Thus, the problem of a large number of interconnection lines on a single board is solved, and the wiring of the single board is simplified.

It should be noted that for specific examples of this embodiment, the examples described in the above embodiments and alternative implementations can be referred to, which will not be repeated here in this embodiment.

Example Implementation

The embodiment of the present disclosure will be further described below in conjunction with exemplary scenarios. It is to be noted that the schemes provided by this embodiment are applicable to any interaction protocol between an AI chip and an AD/DA converter. In this embodiment, only the JESD204 protocol is used as an example for explanation.

The JESD204 protocol is a general interface standard for implementing data interaction between an FPGA or ASIC and an AD/DA converter. The protocol itself is more focused on realizing data transmission and deterministic latency.

This example implementation provides an embodiment scheme that relies on the JESD204 interface but does not use the frame structure of the protocol itself, and transmits the control signals in the data stream in a manner of self-framing so as to take into consideration the limitations imposed by the evolution of the protocol itself.

The transmission bit width (denoted by a parameter N') of the data in the JESD204 protocol is user-definable and is usually defined as an integer multiple of 4 bits or 8 bits for the convenience of framing and deframing in actual use. The protocol uses N' to denote the transmission bit width for framing and deframing at the JESD204 interface and to indicate a real transmission bit width of a piece of sampled data. For example, N'=16 represents that a piece of sampled data is finally transmitted in the form of 16 bits at the JESD204 interface, and N'=12 represents that a piece of sampled data is finally transmitted in the form of 12 bits at the JESD204 interface.

However, in actual use, the size of the bit width required for the data itself is related to system requirements and does not necessarily require such a large bit width as eventually presented at the JESD204 interface or for all time periods. Moreover, the value of the parameter N' is often larger than the actual required bit width to satisfy the transmission requirements of the JESD204 protocol.

Example 1: The data-required bit width is smaller than the definition of parameter N', and more redundant bits are added to the data to satisfy the framing requirements of the transmission. That is, N'=data-required bit width+redundant bit(s) (which may also be referred to as "invalid bit(s)")

Example 2: Only in certain time periods (in which, for example, large signals appear), the data-required bit width is equal to the definition of parameter N', and in other time periods (in which, for example, small signals appear), the data-required bit width needs to be smaller than the definition of parameter N'. In general, to simplify the design, the data-required bit width in each time period is uniformly defined as the same as the parameter N', but in some time periods, the redundant bits exist in the data.

These redundant bits occupy transmission resources but cannot transmit any valid information. The scheme provided by this example implementation is to use these redundant bits to form an independent transmission channel and transmit the signals that are originally transmitted through the IO pins in the form of the data packet. The signals, for example, may be at least one of control information, alarm information, status indications, interaction instructions, etc. The control information may be switch control information, gain control information, and other information.

This example implementation provides a method for transmitting user-defined information by using the invalid bits in the data under the data interaction protocol, such as the JESD204 protocol, for an AI chip and an AD/DA converter. The method has flexible definitions and diverse embodiments. For example, this implementation uses some data bits (such as the invalid bits) under the JESD204 interface protocol to establish the independent transmission channel that may use the SERializer/DESerializer (SERDES) to transmit the customized information, such as the user-defined information, or, such as the control information that would have been implemented through the IO pins, thus saving the IO resources of the chip and reducing the wiring pressure of the single board.

In an example implementation, the user-defined information is incorporated on the user side of the transmission layer of the JESD204 protocol and is not affected by the version of the JESD204 protocol.

In an example implementation, the user-defined information is stored in the invalid bits of the data. These invalid bits may be some fixed bits that are set as long-term invalid bits in the data or may be some bits in the data within a certain time period.

In an example implementation, the transmission channel is constituted by these invalid bits, and no normal valid data are occupied.

In an example implementation, one transmission channel may be constituted by a single piece of sampled data (one M) or multiple pieces of sampled data (multiple Ms), where M is a specialized term according to the JESD204 protocol and is described in the protocol as the AD/DA converter. For example, one M refers to one ADC or DAC.

In an example implementation, the clock of the transmission channel is the working clock of the sampled data, and no extra clock resources are required.

In an example implementation, transmission contents of each transmission channel can be customized. For an interchip interconnection system having multiple transmission channels, the user-defined information may be transmitted by using only one certain transmission channel or multiple transmission channels.

In an example implementation, in the transmission channel, the user-defined information is transmitted in the form of a data packet. This scheme uses multiple types of basic structures to define the data packet.

In an example implementation, 1 bit in the invalid bits may be used for specifying the boundary of the data packet, and 1 bit or multiple bits may be used for transmitting the information. When the bit specifying the boundary is in an invalid state, it indicates that the current data packet is invalid, and the transmitted information is invalid.

In an example implementation, multiple states may be used for specifying the boundary of the data packet. When no user information is transmitted, the transmission channel is in an idle state. When the user information requires to be transmitted, the user-defined data packet is transmitted. It is to be noted that the "state" herein refers to the current state of the transmission channel. The transmission channel does not necessarily need to transmit valid packets all the time, so when the transmission channel does not need to transmit a valid packet, for example, the transmission channel does not transmit anything but an IDLE code to tell a recipient that the current state is idle. Once there is a packet to be transmitted, the transmission channel changes from the idle state to a valid packet format. When the recipient finds that the valid packet format is received, the recipient considers that the system is not in the idle state and starts to receive the packet.

In an example implementation, for the transmission channel that appears only within a certain time period, additional identifiers may be added as required to indicate the start and end of this time period.

Example Implementation I

FIG. 4 is a schematic diagram of a transmission channel in a first example implementation according to an embodiment of the present disclosure. The structure definition of the transmission channel is as shown in FIG. 4: a complex sampling signal of N'=16 is used as an example, the data-required bit width is 14 bits, 2 low bits in the 16 bits are fixed bits that are set as long-term invalid bits, one complex sampling data channel I+Q constitutes one transmission channel, and 1 bit is used for specifying the boundary of the data packet in the transmission channel.

In an example implementation, in the transmission channel, the signals to be transmitted are distributed in each data packet for being transmitted. FIG. 5 is a schematic diagram of a data packet in the first example implementation according to an embodiment of the present disclosure. As shown in FIG. 5, in an example implementation, the structure of the data packet is described as follows.

In an example implementation, a pull-down CS indicates the boundary of one data packet, where CS means chip selection. In the interface protocol, the CS is transmitted from a transmitting end to a receiving end. When the CS is valid (e.g., 0), it means that the transmitting end informs the receiving end that the receiving end is selected at this moment and the data interaction may be performed between the transmitting end and the receiving end. The CS may be one independent bit and may be configured as 0 or 1. The pull-down CS indicates that the CS changes from 1 to 0 from a certain moment and may indicate the start of a data packet. After a time period, the CS changing from 0 to 1 indicates the end of the data packet. The time period in which the CS signal is 0 indicates the validity boundary of the data packet.

In an example implementation, each data packet consists of Header, Payload, and Chk.

In an example implementation, the Header is configured to indicate the type of the data packet, and its length X may be defined as required.

In an example implementation, the Payload is configured to transmit valid information, such as the above-mentioned control signals, and its length Y may be defined as required.

In an example implementation, the Chk is configured for check and may be a parity check, a CRC check, etc., and its length Z may be defined as required.

In an example implementation, the boundary of one data packet may be indicated by the Header, the Tail, a start state, an end state, etc. of the data packet.

Example Implementation II

Figure 6:
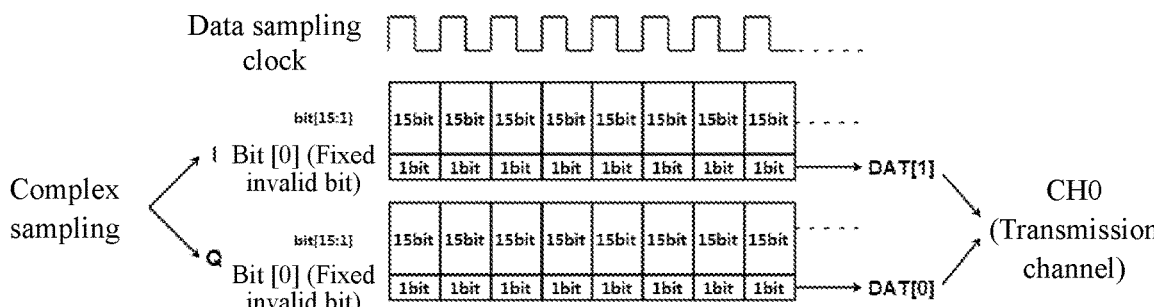
FIG. 6 is a schematic diagram of a transmission channel in a second example implementation according to an embodiment of the present disclosure.

FIG. 6 is a schematic diagram of a transmission channel in a second example implementation according to an embodiment of the present disclosure. As shown in FIG. 6, a complex sampling signal of N'=16 is used as an example, the data-required bit width is 14 bits, the lowest 1 bit in the 16 bits is the fixed long-term invalid bit, one complex sampling data channel I+Q constitutes one transmission channel, and a state is used to specify the boundary of the data packet.

Figure 7:
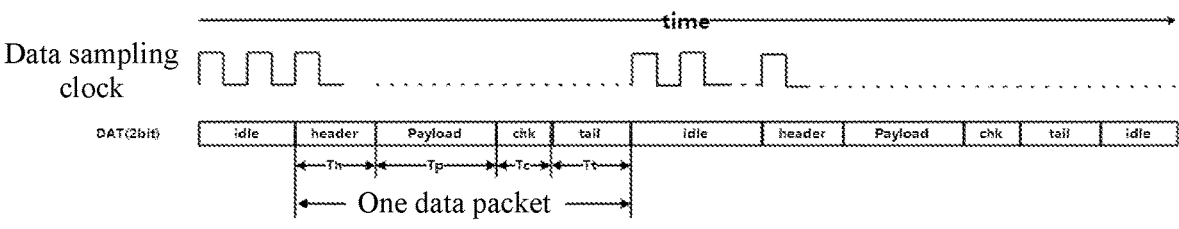
FIG. 7 is a schematic diagram of a data packet in the second example implementation according to an embodiment of the present disclosure.

In an example implementation, in the transmission channel, the signals to be transmitted are distributed in each data packet for being transmitted. FIG. 7 is a schematic diagram of a data packet in the second example implementation according to an embodiment of the present disclosure. As shown in FIG. 7:

In an example implementation, the structure of the data packet is described as follows.

In an example implementation, when no data packet is transmitted, the channel keeps transmitting the idle state.

In an example implementation, the idle state is represented in a fixed code format.

In an example implementation, each data packet consists of Header, Payload, Chk and Tail.

In an example implementation, the Header is configured to indicate the type of the data packet, the definition of the header does not include the fixed code of the idle state, and its length A may be defined as required.

In an example implementation, the Payload is configured to transmit valid information, such as the above-mentioned control signals, and its length B may be defined as required.

In an example implementation, the Chk is configured for check and may be a parity check, a CRC check, etc., and its length C may be defined as required.

In an example implementation, the Tail is configured to indicate the end of the data packet, and its length D may be defined as required.

Example Implementation III

Figure 8:
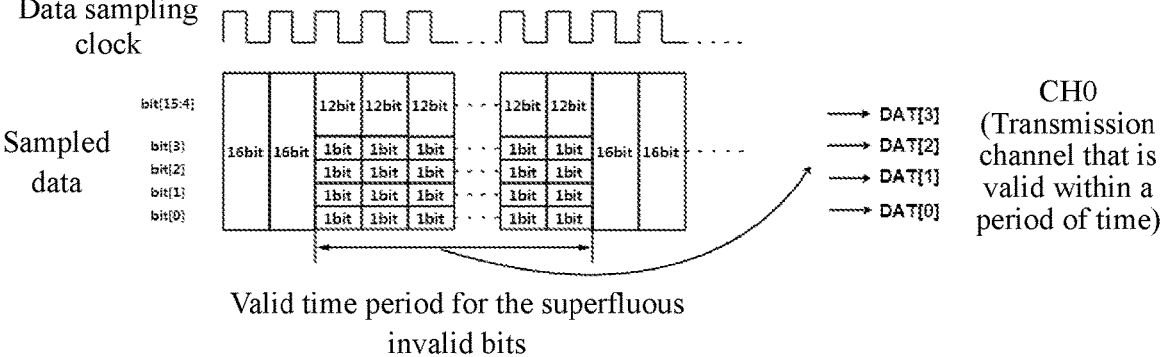
FIG. 8 is a schematic diagram of a transmission channel in a third example implementation according to an embodiment of the present disclosure.

FIG. 8 is a schematic diagram of a transmission channel in a third example implementation according to an embodiment of the present disclosure. As shown in FIG. 8, a single sampling signal of N'=16 is used as an example, under normal circumstances, 16 bits of the data are all valid while no user-defined information is transmitted. However, in some time periods, 12 bits of the data are valid, in which case the redundant 4 bits in the 16 bits constitute a transmission channel that is valid within a period of time.

Figure 9:
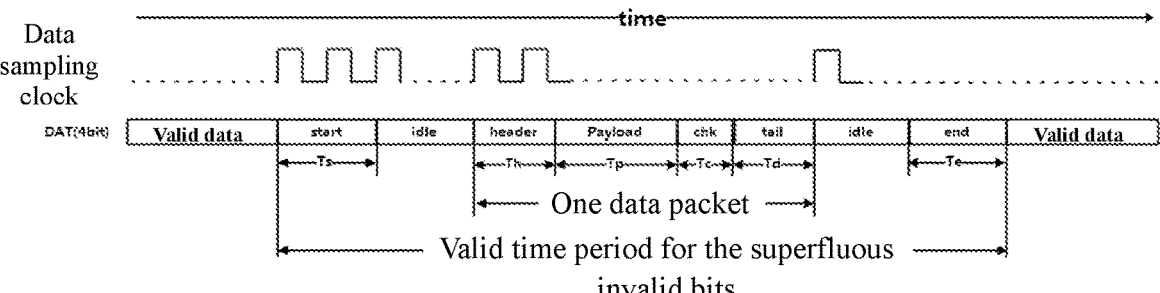
FIG. 9 is a schematic diagram of a data packet in the third example implementation according to an embodiment of the present disclosure.

In an example implementation, within the validity time period of the transmission channel, the signals to be transmitted are distributed in each data packet for being transmitted. FIG. 9 is a schematic diagram of a data packet in the third example implementation according to an embodiment of the present disclosure. As shown in FIG. 9:

In an example implementation, the data packet structure in the third example implementation is described as follows.

In an example implementation, Start is used for indicating that the user-defined transmission validity time period starts, and Start consists of a set of special codes, and its length X may be defined as required. It is to be noted that the transmission validity time period may refer to the validity time period of the superfluous invalid bits. Since the superfluous invalid bits are valid only in a period of time, it is necessary to indicate the start and end of this time period with some special sequences. The Start may be used for indicating that the transmission validity time period starts.

In an example implementation, the idle state is represented in a fixed code format. The idle state indicates that no valid data packet is transmitted.

In an example implementation, each data packet consists of Header, Payload, Chk and Tail.

In an example implementation, the Header is configured to indicate the type of the data packet, the definition of the header does not include the fixed code of the idle state, and its length A may be defined as required.

In an example implementation, the Payload is configured to transmit valid information, such as the above-mentioned control signals, and its length B may be defined as required.

In an example implementation, the Chk is configured for check and may be a parity check, a CRC check, etc., and its length C may be defined as required.

In an example implementation, the Tail is configured to indicate the end of the data packet, and its length D may be defined as required.

In an example implementation, End is used for indicating that the user-defined transmission validity time period ends and consists of a set of special codes, and its length Y may be defined as required. the End corresponds to the above-mentioned Start. The End is applied to the superfluous invalid bits. End may indicate when the superfluous invalid bits end (i.e., the transmission validity time period ends).

With the implementations of the present disclosure, the independent transmission channel is constituted by using the redundant bits that are not used or invalid for a long time or a short time in the data. The user-defined signals are integrated into the transmission channel and transmitted between the receiving end and the transmitting end through the SERDES carried in the JESD204 protocol without using independent IO pins.

This implementation may be applied to the single board design including the ASIC and the AD/DA converter and using the JESD204 protocol so that the IO pins of the chip and the wiring pressure of the single board can be reduced.

A single board with 32 channels is used as an example: at present, when the ASIC is connected to the AD/DA converter, in addition to using the JESD204 interface to transmit data with 32 channels, it is usually necessary to use 32 IO pins to transmit a send enable control, 32 IO pins to transmit a receive enable control, and 8 pins transmit a feedback enable control.

With this scheme, these 32+32+8=72 IO pins do not need to be wired on the single board and the control signals can be transmitted with the data in the JESD204 protocol, thereby reducing the wiring layout pressure on the single board.

Through the description of the above embodiments, those of ordinary skill in the art can clearly understand that the method according to the above embodiments may be realized by means of software in addition to necessary general-purpose hardware platforms, and of course may also be realized by hardware, but the former is a more preferable implementation in many cases. Based on this understanding, the substance or the parts that contribute to the existing technology of the technical schemes of the present disclosure may be embodied in the form of software products, which are stored in a storage medium (such as ROM/RAM, magnetic disk, and optical disk) and include several instructions to cause a terminal device (such as a mobile phone, a computer, a server, or a network device) to perform the methods of various embodiments of the present disclosure.

An embodiment of the present disclosure further provides a non-transitory computer-readable storage medium in which a computer program is stored, where the computer program is configured to, when executed, implement the steps of any of the above method embodiments.

In an example implementation, the above-mentioned non-transitory computer-readable storage medium may include, but is not limited to, various media that can store computer programs, such as a USB flash drive, read-only memory (ROM), random access memory (RAM), mobile hard disk, magnetic disk or optical disk.

An embodiment of the present disclosure further provides an electronic apparatus, including a memory and a processor, where a computer program is stored in the memory, and the processor is configured to execute the computer program to implement the steps in any of the above method embodiments.

In an example implementation, the electronic apparatus above may further include transmission apparatus and input/output apparatus, where the transmission apparatus is connected to the processor and the input/output apparatus is connected to the processor.

For specific examples of this embodiment, the examples described in the above embodiments and example implementations can be referred to, which will not be repeated here in this embodiment.

With the embodiments of the present disclosure, since the invalid bits for transmitting the second data in the second transmission channel may be used for transmitting the first data, there is no need for additional interconnection lines to be deployed to transmit the first data. Thus, the problem of a large number of interconnection lines on a single board is solved, and the wiring of the single board is simplified.

Obviously, those having ordinary skill in the art should understand that the above modules or steps of the present disclosure may be implemented by a general-purpose computing device and may be concentrated in one single computing device or distributed in a network composed of a plurality of computing devices, and may be implemented by program codes executable by a computing device, so that they can be stored in a storage device and executed by the computing device(s). Moreover, in some cases, the steps shown or described herein can be performed in a different order, or they can be made into individual integrated circuit modules, or a plurality of the modules or steps can be made into one single integrated circuit module. As such, the present disclosure is not limited to any specified combination of hardware and software.

The above is only the description of some preferable embodiments of the present disclosure, and is not intended to limit the present disclosure. It will be apparent to those having ordinary skill in the art that various modifications and variations can be made to the present disclosure. Any modifications, equivalent substitutions, improvements, etc. made within the principle of the present disclosure shall fall within the scope of protection of the present disclosure.

What is claimed is:

1. A data transmission method, applied between a chip and an analog-to-digital/digital-to-analog (AD/DA) converter, the method comprising:
constituting a first transmission channel with invalid bits in a second transmission channel, wherein the second transmission channel is configured to transmit second data, and the second data comprises traffic data, wherein the invalid bits comprise at least one of: a fixed invalid bit in the second transmission channel, wherein the fixed invalid bit is a preset invalid bit in the second transmission channel, and the fixed invalid bit does not carry the second data; or a superfluous invalid bit in the second transmission channel, wherein the superfluous invalid bit is the invalid bit superfluous for a bit width required by the second data in the second transmission channel; and
transmitting first data through the first transmission channel, wherein the first data comprises customized data, wherein the first data are transmitted through a first data transmission unit in the first transmission channel;
wherein the first data transmission unit comprises at least one of: a type bit, a payload bit, a check bit, a start bit, a stop bit, a transmission validity time start bit, or a transmission validity time end bit, wherein the type bit is configured to indicate a type of the first data transmission unit, the payload bit is configured to transmit the first data, the check bit is configured to check the first data transmission unit, the start bit is configured to indicate a start boundary of the first data transmission unit, the stop bit is configured to indicate an end boundary of the first data transmission unit, the transmission validity time start bit is configured to indicate that transmission validity time starts, and the transmission validity time end bit is configured to indicate that the transmission validity time ends.

2. The method of claim 1, wherein the first transmission channel comprises at least one invalid bit in one second transmission channel, or the first transmission channel comprises at least one invalid bit in a plurality of second transmission channels separately.

3. The method of claim 1, wherein the transmitting first data through a first transmission channel comprises:

transmitting the first data through one first transmission channel; or transmitting the first data through a plurality of first transmission channels separately.

4. The method of claim 1, wherein, transmitting an idle state indication in the first transmission channel when no first data is transmitted in the first transmission channel.

5. The method of claim 1, wherein a clock of the first transmission channel is the same as a clock of the second transmission channel.

6. The method of claim 1, wherein the first transmission channel and the second transmission channel are parallel transmission channels between the same chip and AD/DA converter.

7. A circuit board, comprising:

a chip, and an analog-to-digital/digital-to-analog (AD/DA) converter, wherein a first transmission channel is constituted with invalid bits in a second transmission channel, wherein the second transmission channel is configured to transmit second data between the chip and the AD/DA converter, and the second data comprises traffic data, wherein the invalid bits comprise at least one of: a fixed invalid bit in the second transmission channel, wherein the fixed invalid bit is a preset invalid bit in the second transmission channel, and the fixed invalid bit does not carry the second data; or a superfluous invalid bit in the second transmission channel, wherein the superfluous invalid bit is the invalid bit superfluous for a bit width required by the second data in the second transmission channel;

wherein first data are transmitted between the chip and the AD/DA converter through the first transmission channel, wherein the first data comprises customized data, wherein the first data are transmitted through a first data transmission unit in the first transmission channel;

wherein the first data transmission unit comprises at least one of: a type bit, a payload bit, a check bit, a start bit, a stop bit, a transmission validity time start bit, or a transmission validity time end bit, wherein the type bit is configured to indicate a type of the first data transmission unit, the payload bit is configured to transmit the first data, the check bit is configured to check the first data transmission unit, the start bit is configured to indicate a start boundary of the first data transmission unit, the stop bit is configured to indicate an end boundary of the first data transmission unit, the transmission validity time start bit is configured to indicate that transmission validity time starts, and the transmission validity time end bit is configured to indicate that the transmission validity time ends.

8. A data transmission apparatus, comprising a transmission circuit configured to:

constitute a first transmission channel with invalid bits in a second transmission channel, wherein the second transmission channel is configured to transmit second data, and the second data comprises traffic data, wherein the invalid bits comprise at least one of: a fixed invalid bit in the second transmission channel, wherein the fixed invalid bit is a preset invalid bit in the second transmission channel, and the fixed invalid bit does not carry the second data; or a superfluous invalid bit in the second transmission channel, wherein the superfluous invalid bit is the invalid bit superfluous for a bit width required by the second data in the second transmission channel; and transmit first data through the first transmission channel, wherein the first data comprise customized data, wherein the first data are transmitted through a first data transmission unit in the first transmission channel;

wherein the first data transmission unit comprises at least one of: a type bit, a payload bit, a check bit, a start bit, a stop bit, a transmission validity time start bit, or a transmission validity time end bit, wherein the type bit is configured to indicate a type of the first data transmission unit, the payload bit is configured to transmit the first data, the check bit is configured to check the first data transmission unit, the start bit is configured to indicate a start boundary of the first data transmission unit, the stop bit is configured to indicate an end boundary of the first data transmission unit, the transmission validity time start bit is configured to indicate that transmission validity time starts, and the transmission validity time end bit is configured to indicate that the transmission validity time ends.

9. A non-transitory computer-readable storage medium in which a computer program is stored, wherein the computer program is configured to, when executed, cause the method of claim 1 to be implemented.

10. An electronic apparatus comprising a memory and a processor, wherein the memory is configured to store a computer program, and the processor is configured to execute the computer program to implement the method of claim 1.

* * * * *